United States Patent
Xu et al.

(10) Patent No.: US 11,404,328 B2
(45) Date of Patent: Aug. 2, 2022

(54) SEMICONDUCTOR STRUCTURE AND MANUFACTURING METHOD THEREOF

(71) Applicant: Nexchip Semiconductor Co., LTD, Anhui (CN)

(72) Inventors: Chunlong Xu, Anhui (CN); Ching-Ming Lee, Anhui (CN); Tsung-kai Yang, Anhui (CN)

(73) Assignee: Nexchip Semiconductor Co., LTD, Hefei (CN)

( * ) Notice: Subject to any disclaimer, the term of this patent is extended or adjusted under 35 U.S.C. 154(b) by 0 days.

(21) Appl. No.: 16/936,440

(22) Filed: Jul. 23, 2020

(65) Prior Publication Data

US 2021/0384083 A1    Dec. 9, 2021

(30) Foreign Application Priority Data

Jun. 5, 2020 (CN) .......................... 202010506035.8

(51) Int. Cl.
*H01L 21/8238*  (2006.01)
*H01L 21/762*   (2006.01)
*H01L 27/092*   (2006.01)
*H01L 21/28*    (2006.01)
*H01L 21/311*   (2006.01)

(52) U.S. Cl.
CPC ........... *H01L 21/823878* (2013.01); *H01L 21/76224* (2013.01); *H01L 21/823892* (2013.01); *H01L 27/0928* (2013.01); *H01L 21/28185* (2013.01); *H01L 21/31111* (2013.01)

(58) Field of Classification Search
CPC ..... H01L 21/823878; H01L 21/823892; H01L 27/0928; H01L 21/76224
See application file for complete search history.

(56) References Cited

U.S. PATENT DOCUMENTS

| | | | | |
|---|---|---|---|---|
| 5,177,028 A * | 1/1993 | Manning | ........... | H01L 21/28123 148/DIG. 50 |
| 6,143,635 A * | 11/2000 | Boyd | ................ | H01L 21/76224 257/E21.434 |
| 6,153,494 A * | 11/2000 | Hsieh | ................ | H01L 21/76224 257/E21.546 |
| 6,333,218 B1 * | 12/2001 | Ngo | ................ | H01L 21/02164 257/E21.279 |
| 6,677,224 B2 * | 1/2004 | Tseng | ................ | H01L 27/11521 438/257 |

(Continued)

*Primary Examiner* — Bac H Au

(57) ABSTRACT

The present disclosure provides a semiconductor structure and a manufacturing method thereof. The method includes: preparing a semiconductor substrate; sequentially forming an oxide layer and a sacrificial layer on the semiconductor substrate, the thickness of the oxide layer is a first thickness; forming a plurality of trenches in the semiconductor substrate, wherein the trenches extending from the sacrificial layer into the semiconductor substrate; forming an isolation dielectric layer on the plurality of trenches and the sacrificial layer, and removing the isolation dielectric layer on the sacrificial layer to form a plurality of isolation structures; forming a well region in the semiconductor substrate; processing the oxide layer by an etching process, so that the thickness of the oxide layer is equal to a second thickness, the first thickness is greater than the second thickness; and forming a polysilicon gate on the etched oxide layer.

10 Claims, 6 Drawing Sheets

(56) References Cited

U.S. PATENT DOCUMENTS

| | | | |
|---|---|---|---|
| 6,689,665 B1* | 2/2004 | Jang | H01L 21/76224 257/506 |
| 7,105,399 B1* | 9/2006 | Dakshina-Murthy | H01L 21/823807 257/E21.633 |
| 7,183,180 B2* | 2/2007 | Lojek | H01L 27/11526 257/E29.302 |
| 7,525,164 B2* | 4/2009 | Forbes | H01L 21/26506 257/396 |
| 9,111,785 B2* | 8/2015 | Gregory | H01L 29/66651 |
| 9,362,372 B2* | 6/2016 | Chen | H01L 29/518 |
| 2002/0013035 A1* | 1/2002 | Knotter | H01L 21/31053 438/424 |
| 2003/0143854 A1* | 7/2003 | Chen | H01L 21/02274 438/700 |
| 2004/0009635 A1* | 1/2004 | Nakasato | H01L 21/823857 257/E21.639 |
| 2004/0063263 A1* | 4/2004 | Suzuki | H01L 21/76283 438/197 |
| 2004/0241956 A1* | 12/2004 | Eun | H01L 21/76224 438/424 |
| 2004/0241981 A1* | 12/2004 | Doris | H01L 21/84 438/637 |
| 2006/0030136 A1* | 2/2006 | Chen | H01L 21/76232 438/585 |
| 2006/0076606 A1* | 4/2006 | Lojek | H01L 27/11526 438/257 |
| 2007/0218619 A1* | 9/2007 | Cha | H01L 21/76224 257/E21.546 |
| 2008/0268624 A1* | 10/2008 | Kwak | H01L 21/26513 438/527 |
| 2008/0274595 A1* | 11/2008 | Spencer | H01L 21/84 438/154 |
| 2009/0159981 A1* | 6/2009 | Niimi | H01L 21/823481 257/369 |
| 2010/0163998 A1* | 7/2010 | Sridhar | H01L 21/823481 257/368 |
| 2010/0244198 A1* | 9/2010 | Jaeger | H01L 21/823807 257/616 |
| 2012/0080754 A1* | 4/2012 | Ema | H01L 27/0928 257/368 |
| 2012/0156846 A1* | 6/2012 | Thees | H01L 21/76232 438/285 |
| 2012/0184107 A1* | 7/2012 | Sato | H01L 21/02236 438/703 |
| 2013/0122684 A1* | 5/2013 | Hsuan | H01L 21/823462 438/400 |
| 2013/0334584 A1* | 12/2013 | Tang | H01L 21/823857 257/315 |
| 2014/0001540 A1* | 1/2014 | Wang | H01L 29/517 257/329 |
| 2014/0151759 A1* | 6/2014 | Loubet | H01L 29/1608 257/288 |
| 2014/0284681 A1* | 9/2014 | Terada | H01L 21/76224 257/315 |
| 2015/0318294 A1* | 11/2015 | Wang | H01L 29/66825 257/315 |
| 2018/0190537 A1* | 7/2018 | Li | H01L 21/30604 |

* cited by examiner

SEMICONDUCTOR STRUCTURE AND MANUFACTURING METHOD THEREOF

CROSS REFERENCES TO RELATED APPLICATIONS

This application claims the benefit of priority to Chinese Patent Application No. CN 2020105060358, filed with CNIPO on Jun. 5, 2020, the contents of which are incorporated herein by reference in its entirety.

TECHNICAL FIELD

The present disclosure relates to the technical field of semiconductor, and in particular, to a semiconductor structure and a manufacturing method thereof.

BACKGROUND

With the rapid development of semiconductor manufacturing technology, in order to achieve faster computing speed, higher information storage capacity, and more other functions of semiconductor devices, semiconductor chips have a higher integration. A gate oxide layer is formed by oxidizing silicon on the surface layer of a substrate into silicon dioxide, and is used as an oxide dielectric layer for isolating. In large scale integrated circuits, the performance of a gate oxide layer directly determines the performance, reliability, and yield of integrated circuits. The quality of the gate oxide layer is critical to the performance and yield of eventually formed semiconductor devices. If the surface of the gate oxide layer has a large number of defects, after a gate structure is formed on the gate oxide layer, the surface of the gate oxide layer in contact with the gate structure will have a large number of defects, lower reliability of semiconductor devices will be caused, which will result in losses of the yield and performance of the devices.

SUMMARY

The present disclosure provides a semiconductor structure and a manufacturing method thereof, so as to improve the quality of a gate oxide layer, thereby improving the reliability of semiconductor devices.

The present disclosure provides a method for manufacturing a semiconductor structure, including: preparing a semiconductor substrate; sequentially forming an oxide layer and a sacrificial layer on the semiconductor substrate, the thickness of the oxide layer is a first thickness; forming a plurality of trenches in the semiconductor substrate, wherein the trenches extending from the sacrificial layer into the semiconductor substrate; forming an isolation dielectric layer on the plurality of trenches and the sacrificial layer, and removing the isolation dielectric layer on the sacrificial layer to form a plurality of isolation structures; forming a well region in the semiconductor substrate; Etching part of the oxide layer, so that the thickness of the oxide layer is a second thickness, the first thickness is greater than the second thickness; and forming a polysilicon gate on the etched oxide layer.

Further, the first thickness is 450 Å to 500 Å, and the thickness of the sacrificial layer is 1400 Å to 1600 Å.

Further, the depth of the trench is 2000 Å to 9000 Å.

Further, before forming the well region, the method further includes: removing the sacrificial layer.

Further, the well region includes a first well region and a second well region.

Further, the depth of the first well region is 1.4 μm to 1.6 μm, and the depth of the second well region is 1.4 μm to 1.6 μm.

Further, the isolation structures are located between the first well region and the second well region.

Further, the oxide layer is etched with a dilute hydrofluoric acid solution, the ratio of hydrofluoric acid in the dilute hydrofluoric acid solution to deionized water is 1:300 to 1:400, and an etching time is 300 s to 400 s.

Further, the second thickness is 380 Å to 400 Å.

The present disclosure further provides a semiconductor structure, including: a semiconductor substrate; an oxide layer, disposed on the semiconductor substrate; a plurality of isolation structures, disposed in the semiconductor substrate, the top surface of the isolation structure is higher than the surface of the semiconductor substrate; a first well region, disposed in the semiconductor substrate; a second well region, disposed in the semiconductor substrate, where the plurality of isolation structures are located between the first well region and the second well region; and a gate structure, disposed on the oxide layer.

In conclusion, the present disclosure provides a semiconductor structure and a manufacturing method thereof. By using the method, the thickness of an oxide layer is increased during the formation of the oxide layer. When a first well region and a second well region are formed in a substrate in the manner of ion implantation, the process of ion implantation may damage the structure of the oxide layer and cause defects on the surface of the oxide layer. A particular thickness of the oxide layer is removed by an etching process, so that the defects on the surface of the oxide layer can be effectively removed, thereby improving the quality of the oxide layer. A gate structure is then formed on the oxide layer, so that the reliability of eventually formed semiconductor devices can be improved.

DESCRIPTION OF REFERENCE NUMERALS

Figure 1:
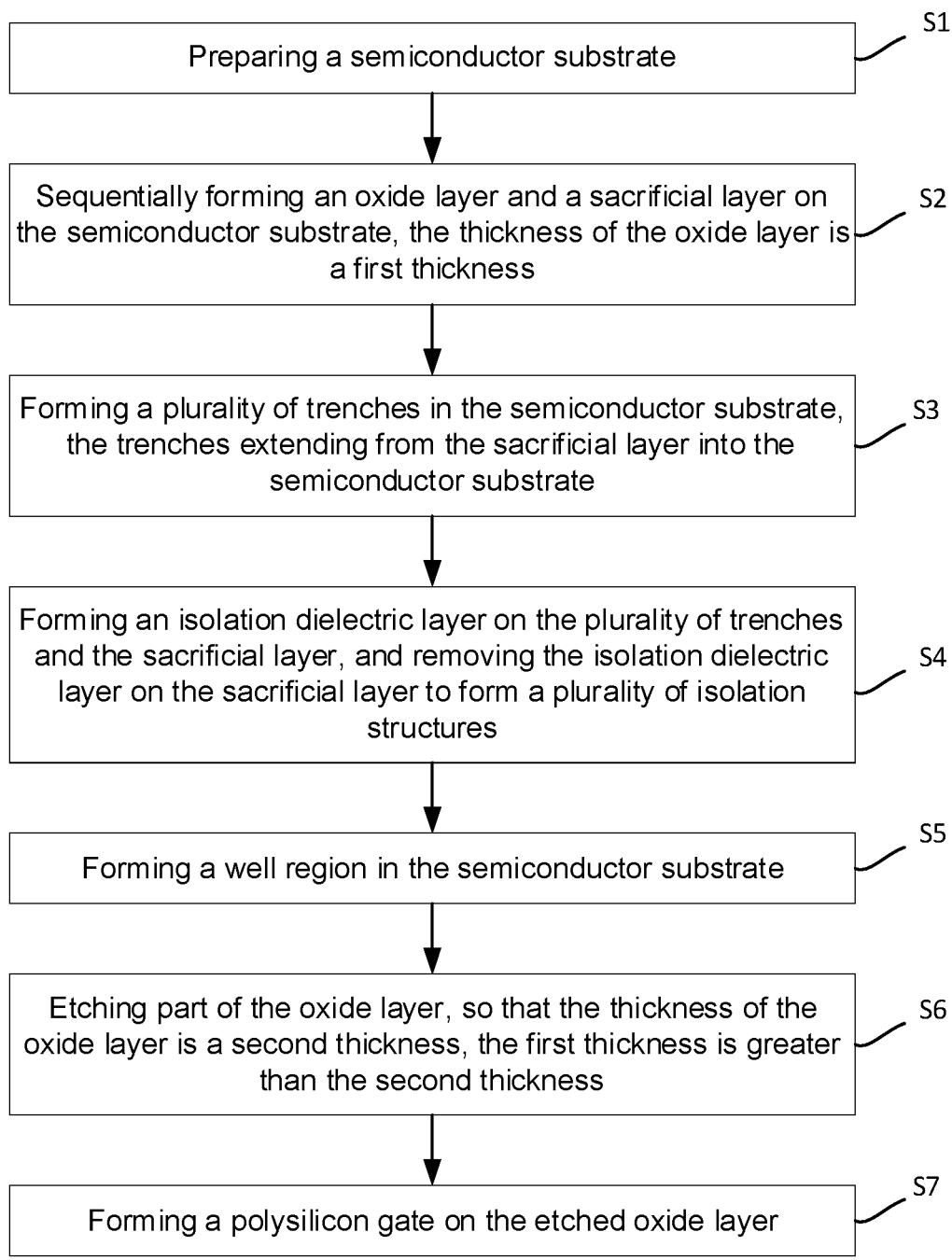
FIG. 1 is a flowchart of a method for manufacturing a semiconductor structure in this embodiment.

| | |
|---|---|
| 101 | Semiconductor substrate |
| 102 | Oxide layer |
| 102a | First oxide layer |
| 102b | Second oxide layer |
| 1021 | First portion |
| 1022 | Second portion |
| 103 | Sacrificial layer |
| 104 | Photoresist layer |
| 104a | Opening |
| 105 | Trench |
| 106 | Isolation dielectric layer |
| 106a | Isolation structure |
| 1061 | Filling portion |
| 1062 | protrusion portion |
| 107 | First well region |
| 108 | Second well region |
| 109 | Polysilicon layer |
| 109a | Gate structure |

DETAILED DESCRIPTION OF THE PREFERRED EMBODIMENTS

The following describes the embodiments of the present disclosure through specific examples. A person skilled in the art can easily understand other advantages and effects of the present disclosure from the content disclosed in this specification. The present disclosure may also be implemented or applied through different specific embodiments. Various details in this specification may also be modified or changed based on different viewpoints and applications without departing from the spirit of the present disclosure.

It should be noted that the drawings provided in the embodiments only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

As shown in FIG. 1, this embodiment provides a method for manufacturing a semiconductor structure. The method may be used for manufacturing, for example, various memories, such as, a non-volatile memory, a programmable read-only memory (ROM), an erasable programmable ROM, and a flash memory. The semiconductor structure manufactured by using the method is highly reliable. The method may include the following steps.

S1: Preparing a semiconductor substrate.

S2: Sequentially forming an oxide layer and a sacrificial layer on the semiconductor substrate, the thickness of the oxide layer is a first thickness.

S3: Forming a plurality of trenches on the semiconductor substrate, the trenches extends from the sacrificial layer to the semiconductor substrate.

S4: Forming an isolation dielectric layer on the plurality of trenches and the sacrificial layer, and removing the isolation dielectric layer on the sacrificial layer to form a plurality of isolation structures.

S5: Forming a well region in the semiconductor substrate.

S6: Etching par of the oxide layer by an etching process, so that the thickness of the oxide layer is a second thickness, the first thickness is greater than the second thickness.

S7: Forming a polysilicon gate on the etched oxide layer.

Figure 2A:
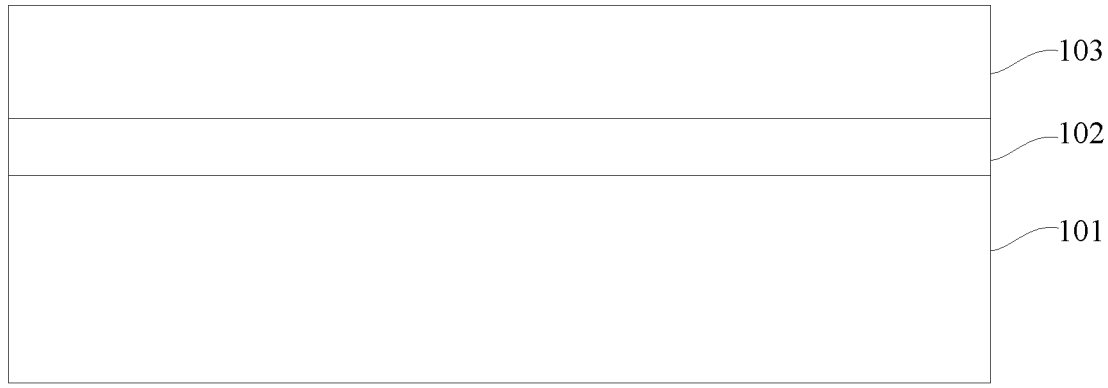
FIG. 2A is a schematic diagram of a semiconductor substrate.

As shown in FIG. 2A, in step S1, a semiconductor substrate 101 is provided. The semiconductor substrate 101 may be one of monocrystalline silicon, polycrystalline silicon, and amorphous silicon. The semiconductor substrate 101 may also be one of a silicon germanium compound and a silicon gallium compound. The semiconductor substrate 101 may include an epitaxial layer or a silicon on insulator (SOI) structure.

As shown in FIG. 2A, in step S2, the surface of the semiconductor substrate 101 is cleaned to remove impurity particles or other pollutants on the surface of the semiconductor substrate 101. An oxide layer 102 is then formed on the semiconductor substrate 101. A method for forming the oxide layer 102 may be high temperature furnace tube oxidation, rapid thermal oxidation, or in-situ vapor generation oxidation. In this embodiment, the thickness of the oxide layer 102 is increased by extending the oxidation time. The thickness of the oxide layer 102 is defined as a first thickness. The first thickness may be 450 Å to 500 Å, for example, 470 Å or 480 Å.

Figure 2B:
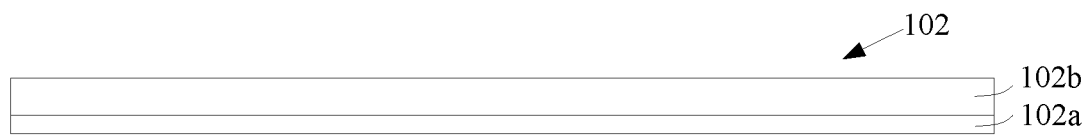
FIG. 2B is a schematic diagram of an oxide layer.

As shown in FIG. 2B, in this embodiment, the oxide layer 102 may be formed, for example, through a process of high temperature furnace tube oxidation. A process for forming the oxide layer 102 includes: placing the semiconductor substrate 101 in a tube furnace, introducing oxygen, and oxidizing the surface of the semiconductor substrate 101 at the temperature of 800° C. to 900° C. to form a thin oxide dielectric layer, that is, a first oxide layer 102a. The thickness of the first oxide layer 102a may be 150 Å, and a growth time of the first oxide layer 102a may be within 5 minutes. In this embodiment, the growth curve of the first oxide layer 102a is linear-shaped. In this case, the growth efficiency of the first oxide layer 102a is high, and the thickness uniformity of the first oxide layer 102a is poor. After the first oxide layer 102a is formed, the semiconductor substrate 101 with the first oxide layer 102a may be annealed under the protection of nitrogen or inert gas at the temperature of 1000° C. to 1200° C. During the annealing, the nitrogen or inert gas is introduced into the tube furnace, and all the oxygen in the tube furnace is displaced to avoid a further growth of the first oxide layer 102a. The flow of the nitrogen or inert gas may be 6 L/min to 10 L/min. After the annealing is completed, a second oxide layer 102b is formed on the surface of the first oxide layer 102a with the presence of hydrogen chloride at the temperature of 800° C. to 900° C. The thickness of the second oxide layer 102b may be 300 Å to 350 Å, and the introduction of a small amount of hydrogen chloride in the growth process of the second oxide layer 102b can reduce the content of movable metal ion charges in the oxide layer 102. The flow rate of hydrogen chloride may be 0.1 L/min to 0.2 L/min, and the flow rate of oxygen may be 8 L/min to 12 L/min. In this embodiment, the growth curve of the second oxide layer 102b is parabolic-shaped, the growth rate of the second oxide layer 102b is slow, the thickness uniformity of the second oxide layer 102b is adequate. The thickness of the second oxide layer 102b is 300 Å to 350 Å, and the growth time of the second oxide layer 102b may be within 30 minutes. After the second oxide layer 102b reaches the set thickness, nitrogen or inert gas is used to displace oxygen in the tube furnace to avoid a further growth of the second oxide layer 102b, and the temperature is then reduced to complete the fabrication of the oxide layer 102.

As shown in FIG. 2A, in step S2, after the oxide layer 102 is formed, a sacrificial layer 103 is formed on the oxide layer 102. The material of the sacrificial layer 103 may be silicon nitride. The sacrificial layer 103 may be formed by low pressure chemical vapor deposition, sub-atmospheric pressure chemical vapor deposition, atmospheric pressure chemical vapor deposition, ion-enhanced chemical vapor deposition or high density plasma chemical vapor deposition. In this embodiment, the thickness of the sacrificial layer 103 may be, for example, 1400 Å to 1600 Å, preferably, 1500 Å. The sacrificial layer 103 is also used as a stop layer of a medium material filled in a chemical-mechanical planarization trenches.

Figure 3:
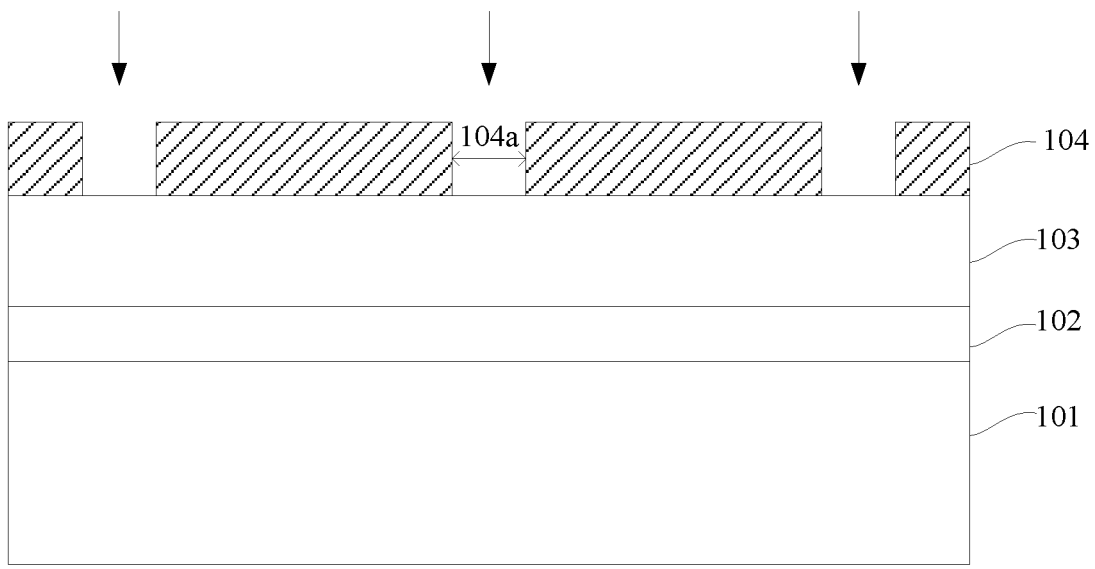
FIG. 3 is a schematic diagram after forming a photoresist layer on a sacrificial layer.
Figure 4:
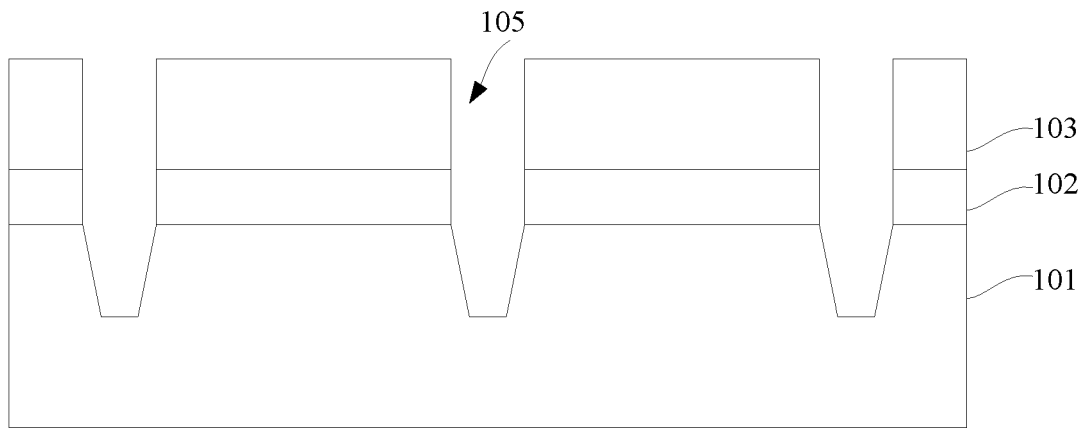
FIG. 4 is a schematic diagram after forming a trench.

As shown in FIG. 3 and FIG. 4, in step S2, a photoresist layer 104 is formed on the sacrificial layer 103. The photoresist layer 104 includes a plurality of openings 104a, and the openings 104a expose the surface of the sacrificial layer 103. In this embodiment, the position of the trenches are defined by the openings 104a. That is, the trenches are formed by etching downward through the openings 104a. In other word, a plurality of trenches 105 in the semiconductor substrate 101 is formed by sequentially removing the sacrificial layer 103, the oxide layer 102, and part of the semiconductor substrate 101 below the openings 104a. In this embodiment, the sacrificial layer 103, the oxide layer 102, and part of the semiconductor substrate 101 may be sequentially removed by dry etching. That is, the sacrificial layer 103 and the oxide layer 102 are sequentially etched with the photoresist layer 104 used as a mask layer. The photoresist layer 104 is then removed, and the semiconductor substrate 101 is then etched with the sacrificial layer 103 and oxide layer 102 used as a mask layer. It can be seen from FIG. 4 that a plurality trenches 105 are formed in the semiconductor substrate 101, and three trenches 105 are shown in FIG. 4. The trenches 105 extend from the sacrificial layer 103 to the semiconductor substrate 101. That is, an upper end of the trenches 105 is located in the sacrificial layer 103 and the oxide layer 102, and a lower end of the trenches 105 is located in the semiconductor substrate 101, the upper end of the trenches 105 is rectangular, and the lower end of the trenches 105 is inverted trapezoid-shaped. The depth of the trenches 105 may be between 2000 Å to 9000 Å, for example, 3000 Å, 6000 Å or 8000 Å.

As shown in FIG. 3 and FIG. 4, a method for forming the trenches 105 may be plasma dry etching. An etching gas selected for plasma dry etching is to make a side wall of the trenches 105 smooth, have a few lattice defects and make the a bottom edge corner of the trenches 105 smooth. The etching gas also makes the side wall of the trenches 105 have an inclined profile. The etching gas may be $Cl_2$, HBr or mixed gas of HBr with other gases, for example, a mixed gas of HBr with $O_2$ and $Cl_2$, or a mixed gas of HBr with $NF_3$ and He. The depth of the trenches 105 formed by etching may be controlled by an etching time. An arrow in FIG. 3 indicates an etching direction.

Figure 5:
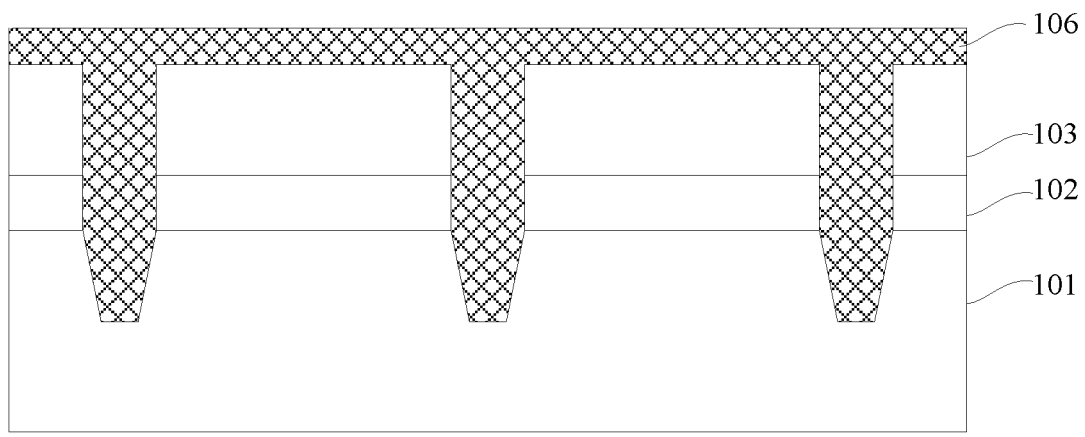
FIG. 5 is a schematic diagram after forming an isolation dielectric layer.

As shown in FIG. 5, in step S4, after the trenches 105 are formed, thermal oxidation is performed to the side wall and a top corner of the trenches 105 to form a thermally oxidized side wall and a thermally oxidized rounded top corner in the trenches 105, so as to improve the isolation performance. An isolation dielectric layer 106 is then formed on the trenches 105 and sacrificial layer 103, for example, through a process of plasma-enhanced chemical vapor deposition. The material of the isolation dielectric layer 106 includes silicon dioxide, silicon nitride, silicon nitride, or the like.

Figure 6:
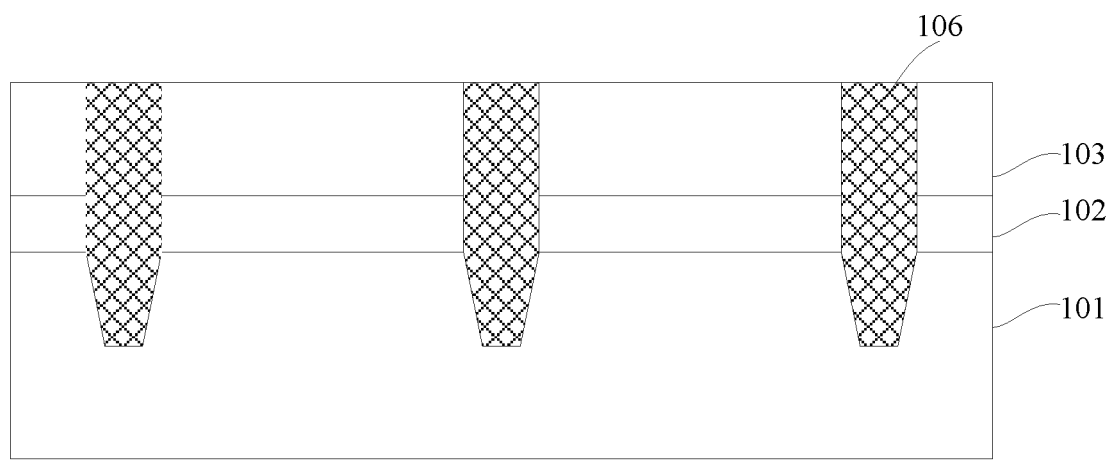
FIG. 6 is a schematic diagram after removing an isolation dielectric layer on a sacrificial layer.
Figure 7:
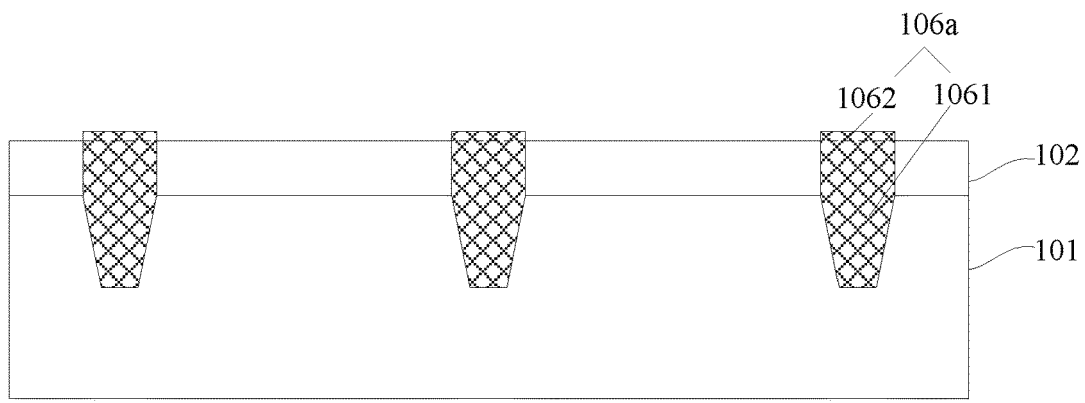
FIG. 7 is a schematic diagram after forming an isolation structure.

As shown in FIG. 6 and FIG. 7, after the isolation dielectric layer 106 is formed, the isolation dielectric layer 106 located on the sacrificial layer 103 may be removed through a chemical-mechanical polishing process to planarize the isolation dielectric layer 106. The removing process stops at the sacrificial layer 103. After the chemical-mechanical polishing process is completed, the sacrificial layer 103 may be removed by using wet etching. For example, a heated phosphoric acid solution is used to contact the sacrificial layer 103. For example, a processing wafer is immersed in one or more types of the phosphoric acid etching solutions, and the temperature of the phosphoric acid etching solution may be 150° C. to 175° C.

As shown in FIG. 7, the sacrificial layer 103 is removed through a wet etching process such that the isolation dielectric layer 106 forms a filling portion 1061 located in the trenches 105 and a protrusion portion 1062 protruding from the filling portion 1061, and the filling portion 1061 and the protrusion portion 1062 form an isolation structure 106a. The filling portion 1061 is located in the semiconductor substrate 101 and the oxide layer 102, and the protrusion portion 1062 protrudes from the oxide layer 102. That is, the top surface of the isolation structure 106a is higher than the surface of the oxide layer 102. The height of the protrusion portion 1062 is 300 Å to 400 Å. The filling portion 1061 and the protrusion portion 1062 are separated by the dashed line in FIG. 7. In this embodiment, the height of the isolation structure 106a is 1500 Å to 6500 Å, for example, 3000 Å, 4000 Å or 5000 Å. In this embodiment, when the sacrificial layer 103 is removed at a later stage, the protrusion portion 1062 can ensure the smoothness of the contact position between the oxide layer 102 and the isolation structure 106a.

As shown in FIG. 6, in some embodiments, the isolation dielectric layer 106 located in a trench may be defined as an isolation structure, and the sacrificial layer 103 may be removed before a well region is formed in the semiconductor substrate 101.

Figure 8:
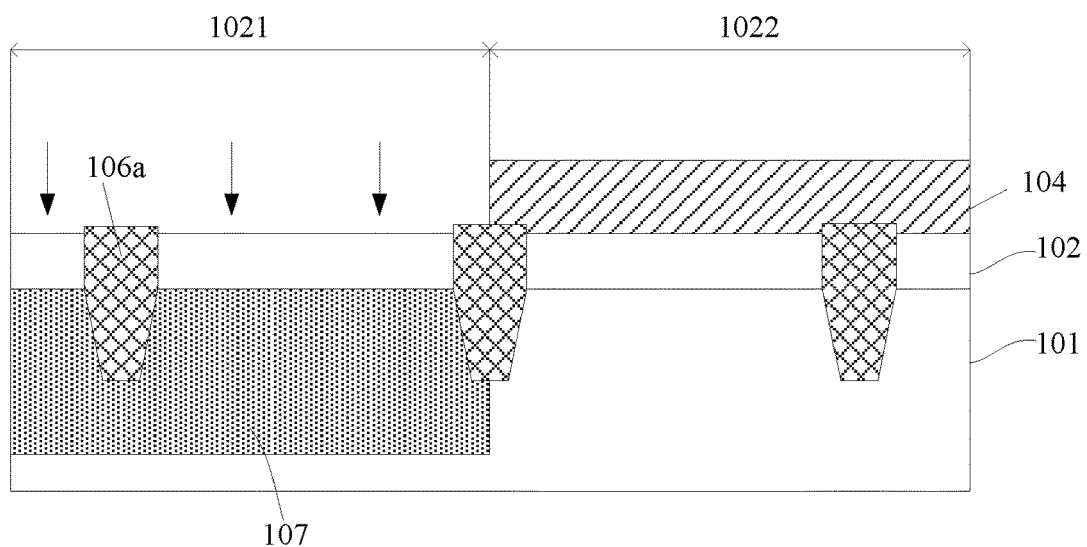
FIG. 8 is a schematic diagram after forming a first well region.
Figure 9:
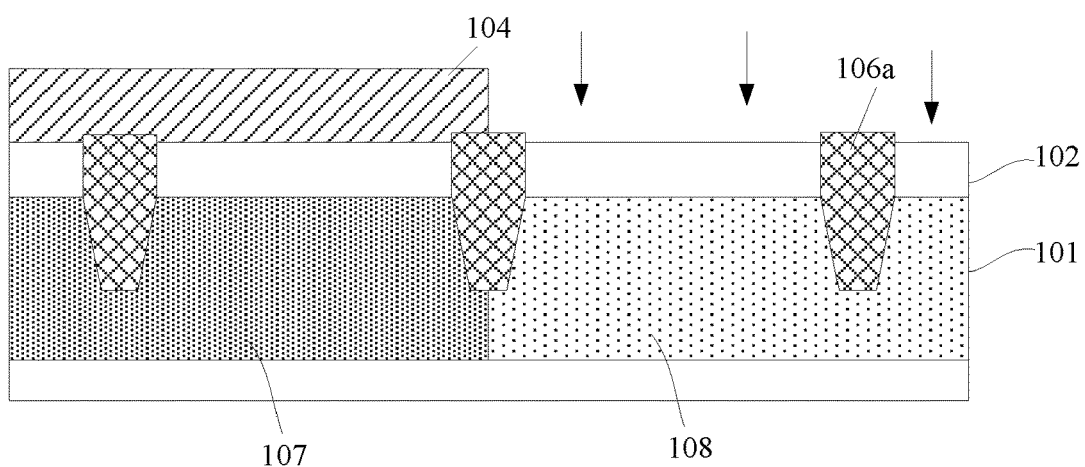
FIG. 9 is a schematic diagram after forming a second well region.

As shown in FIG. 8 and FIG. 9, in step S5, after the isolation structure 106a is formed, a well region is formed in the semiconductor substrate 101 by ion implantation. The well region includes a first well region 107 and a second well region 108. FIG. 8 is a schematic diagram after forming the first well region 107. FIG. 9 is a schematic diagram after forming the second well region 108. Arrows in FIG. 8 and FIG. 9 indicate the direction of ion implantation.

As shown in FIG. 8, the oxide layer 102 is divided into a first portion 1021 and a second portion 1022 according to the isolation structure 106a. It should be noted that the oxide layer 102 is divided into the first portion 1021 and second portion 1022 to clearly describe the positions of the first well region 107 and the second well region 108. When forming the first well region 107, a photoresist layer 104 is formed on the second portion 1022, and first-type doped ions are then implanted into the first portion 1021 by using a method of ion implantation with the mask of the photoresist layer 104, and are diffused to form the first well region 107 in the semiconductor substrate 101. In this embodiment, the depth of the first well region 107 is 1.4 µm to 1.6 µm, for example, 1.5 µm. The first well region 107 may be, for example, an N-type well region, and the first-type doped ions are N-type ions, such as, P ions, As ions or Sb ions.

As shown FIG. 9, after the first well region 107 is formed, a photoresist layer 104 is formed on the first portion 1021, and second-type doped ions are then implanted into the second portion 1022 by ion implantation with the mask of the photoresist layer 104, and are diffused to form the second well region 108 in the semiconductor substrate 101. In this embodiment, the depth of the second well region 108 is 1.4 µm to 1.6 µm, for example, 1.5 µm. The second well region 108 may be, for example, a P-type well region, and the second-type doped ions are P-type ions, such as, B ions, Ga ions or In ions.

Figure 10:
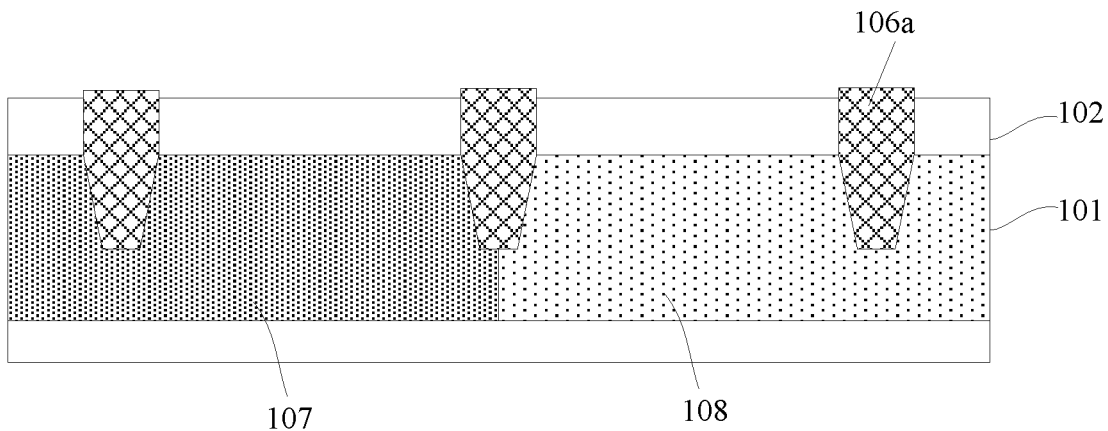
FIG. 10 is a schematic diagram of an oxide layer before etching.

As shown in FIG. 10, in this embodiment, both the first well region 107 and the second well region 108 are formed in the semiconductor substrate 101, and an isolation structure 106a is disposed between the first well region 107 and the second well region 108. The depth of the first well region 107 and the depth of the second well region 108 are the same, for example, 1.5 µm. The first well region 107 may be, for example, an N-type well region. The first well region 107 provides a process platform for forming NMOS devices. The second well region 108 may be, for example, a P-type well region. The second well region 108 provides a process platform for forming PMOS devices. Alternatively, in some embodiments, the first well region 107 may be a P-type well region, the first well region 107 provides a process platform for PMOS devices, and the second well region 108 may be an N-type well region, and the second well region 108 provides a process platform for NMOS devices.

Figure 11:
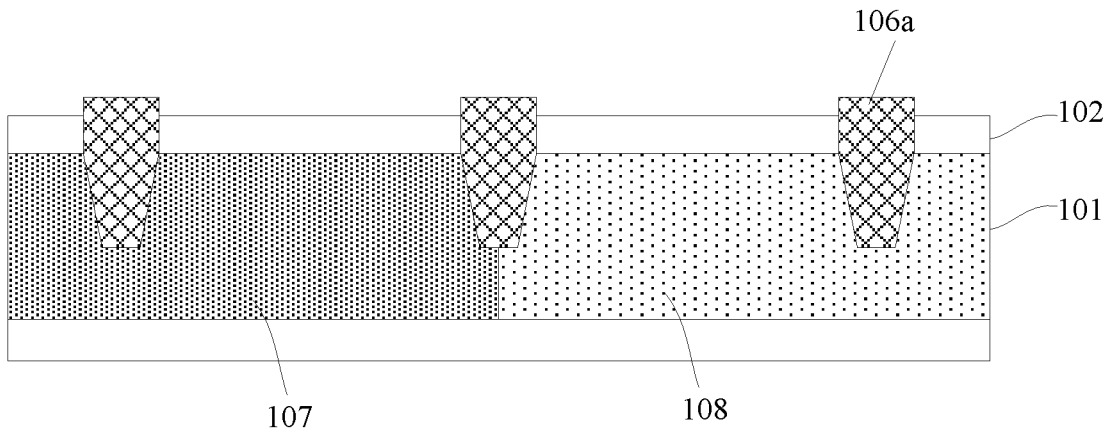
FIG. 11 is a schematic diagram of an oxide layer after wet etching.

As shown in FIG. 10 and FIG. 11, in step S6, the photoresist layer 104 is first removed. Since the first well region 107 and the second well region 108 are formed by using ion implantation, and no passivation layer is formed on the oxide layer 102. During ion implantation, the implanted ions may bombard the surface of the oxide layer 102, resulting in damage to the surface structure of the oxide layer 102 and defects on the surface of the oxide layer 102. The defects on the oxide layer 102 can affect the quality of the oxide layer 102. Therefore, in this embodiment, a particular thickness of the oxide layer 102 is removed by wet etching, defects on the surface of the oxide layer 102 are removed, so that the quality of the oxide layer 102 may be improved. In this embodiment, after the wet etching process, the thickness of the oxide layer 102 is defined as a second thickness. After wet etching, the thickness of the oxide layer 102 may be reduced by, for example, 50 Å to 100 Å, the second thickness is less than the first thickness. After etching process, the second thickness is 380 Å to 400 Å, for example, 400 Å. That is, after the etching process, the thickness of the oxide layer 102 is, for example, 400 Å. In this embodiment, the oxide layer 102 may be etched by, for example, wet etching. The oxide layer 102 is etched with a dilute hydrofluoric acid solution, and the etching time is 200 s to 400 s, for example, 300 s. In this embodiment, the ratio of hydrofluoric acid in the dilute hydrofluoric acid solution to deionized water is 1:300 to 1:400, for example, 1:350. In this embodiment, because the concentration of the dilute hydrofluoric acid solution is low, the thickness of the etched oxide layer 102 can be precisely controlled by controlling the etching time. That is, the eventual thickness of the oxide layer 102 can be controlled.

As shown in FIG. 10 and FIG. 11, in this embodiment, the thickness is increased when the oxide layer 102 is formed. When the surface of the oxide layer 102 has defects, the defects on the oxide layer 102 can be removed by the wet etching as the thickness of the oxide layer 102 is reduced by the wet etching, and it can be ensured that the oxide layer 102 has a particular thickness, so as to prevent the oxide layer 102 from being penetrated.

Figure 12:
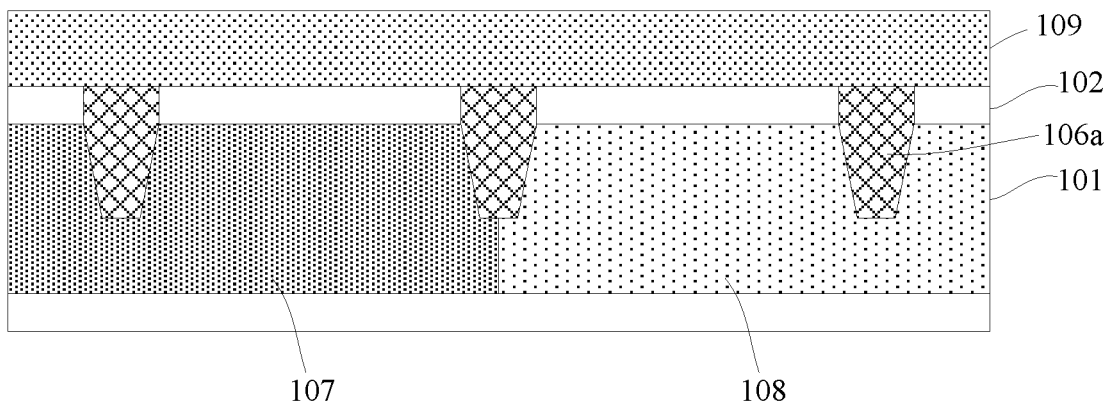
FIG. 12 is a schematic diagram after forming a polysilicon layer.

As shown in FIG. 12, in step S7, after the wet etching process is completed, a polysilicon layer 109 is formed on the oxide layer 102, and the polysilicon layer 109 covers the oxide layer 102 and the isolation structure 106a. The thickness of the polysilicon layer 109 is greater than that of the oxide layer 102. In this embodiment, the polysilicon layer 109 may be formed, for example, with silane as a reaction gas. The thickness of the polysilicon layer 109 may be, for example, between 200 nm and 500 nm, such as 300 nm or 400 nm. Certainly, the thickness of the polysilicon layer 109 may be set according to an actual requirement. In this embodiment, the polysilicon layer 109 is used to form a gate structure, for example, a floating gate electrode, of a semiconductor device.

Figure 13:
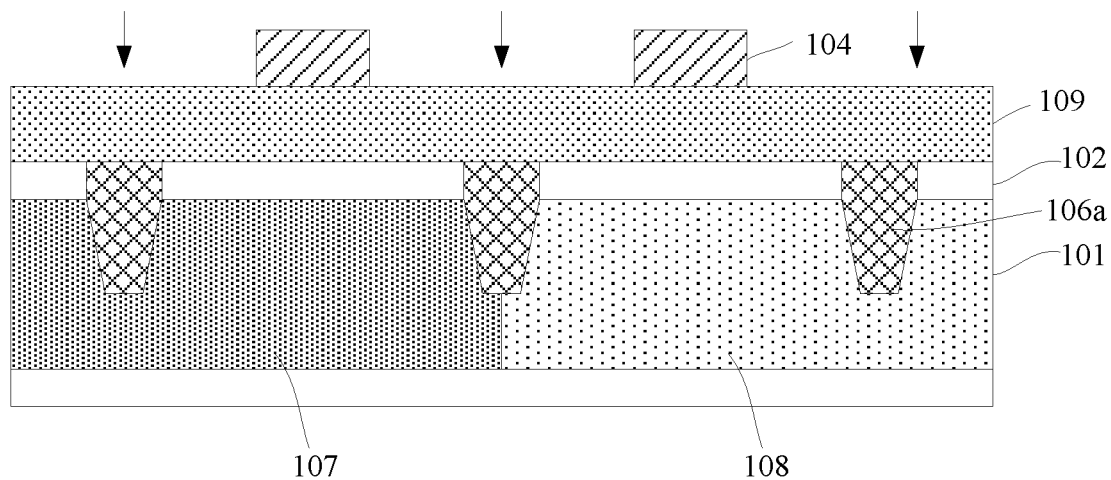
FIG. 13 is a schematic diagram after forming a photoresist layer on a polysilicon layer.
Figure 14:
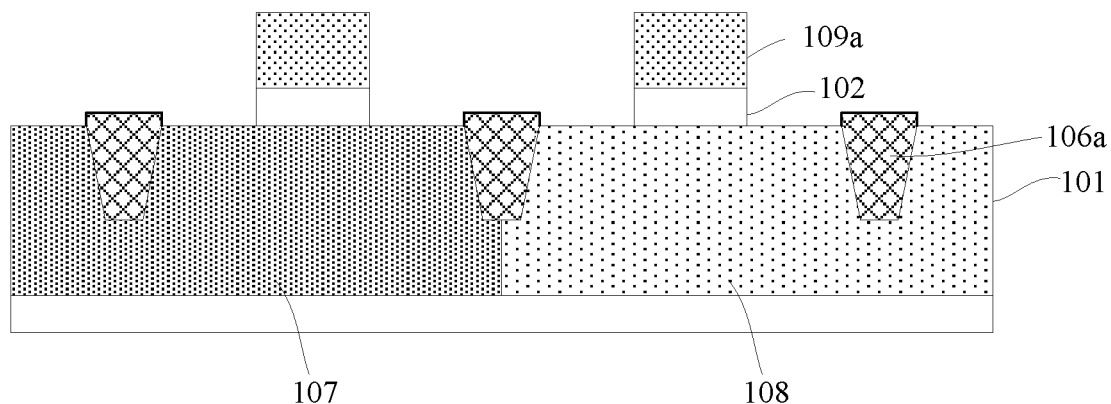
FIG. 14 is a schematic diagram of a semiconductor structure.

As shown in FIG. 13 and FIG. 14, after the polysilicon layer 109 is formed, a photoresist layer 104 is formed on the polysilicon layer 109. The photoresist layer 104 does not completely cover the polysilicon layer 109, and the photoresist layer 104 is located on the areas of the first well region 107 and the second well region 108. Next, downward etching is performed on the semiconductor substrate 101 according to the exposed polysilicon layer 109. That is, the oxide layer 102 and the isolation structure 106a are removed by etching, thereby forming a gate structure 109a. It can be seen from FIG. 14 that two gate structures 109a are shown in FIG. 14. The two gate structures 109a are respectively located on the areas of the first well region 107 and the second well region 108. Specifically, one gate structure 109a is located on an area of the first well region 107, and is located between the two isolation structures 106a, and the other gate structure 109a is located in an area of the second well region 108 and is located between the two isolation structures 106a. An oxide layer 102 is further arranged between the gate structure 109a and the semiconductor substrate 101, and the oxide layer 102 may be defined as a gate oxide layer. In this embodiment, the gate structure 109a may be, for example, a floating gate electrode. In some embodiments, more gate structures 109a, for example, four or eight gate structures 109a, may be formed.

As shown in FIG. 14, in this embodiment, other gate structures, for example, a control gate, may further be formed on the gate structure 109a. Since the subsequent process no longer affects the quality of the oxide layer 102, the subsequent process is no longer described.

FIG. 14 is a schematic diagram of a semiconductor structure in this embodiment. The semiconductor structure includes a semiconductor substrate 101, and the semiconductor substrate 101 includes a first well region 107 and a second well region 108. The first well region 107 is adjacent to the second well region 108. The first well region 107 is, for example, an N-type well region, and the first well region 107 provides a process platform for NMOS devices. The second well region 108 is, for example, a P-type well region, and the second well region 108 provides a process platform for forming PMOS devices. The doped ion type of the first well region 107 is different from the doped ion type of the second well region 108. The doped ions of the first well region 107 are, for example, P ions, As ions or Sb ions, and the doped ions of the second well region 108 are, for example, B ions, Ga ions or In ions. In this embodiment, the depth of the first well region 107 is 1.5 µm, and the depth of the second well region 108 is, for example, 1.5 µm.

As shown in FIG. 14, in this embodiment, a plurality of isolation structures 106a are also disposed on the semiconductor substrate 101, and the isolation structure 106a is located between the first well region 107 and the second well region 108. In this embodiment, the material of the isolation structure 106a may include silicon nitride, silicon oxide, silicon oxynitride or the like. In this embodiment, the material of isolation structure 106a may be silicon oxide. The shape of the longitudinal section of the isolation structure 106a may be set according to an actual requirement. In FIG. 13, as an example, the shape of the longitudinal section of the isolation structure 106a includes an inverted trapezoid. In other examples, the shape of the longitudinal section of the isolation structure 106a may be alternatively U-shaped or the like. The isolation structure 106a is, for example, a shallow trench isolation structure.

As shown in FIG. 14, in this embodiment, the semiconductor substrate 101 may be one of monocrystalline silicon, polycrystalline silicon, and amorphous silicon. In another embodiment, the semiconductor substrate 101 may be a silicon germanium compound or a silicon gallium compound. In other embodiments, the semiconductor substrate 101 may include an epitaxial layer or an Sal structure.

As shown in FIG. 14, in this embodiment, a plurality of oxide layers 102 are further disposed on the semiconductor substrate 101. For example, the two oxide layers 102 are shown, and the two oxide layers 102 are respectively located on the first well region 107 and the second well region 108. Specifically, one oxide layer 102 is located on the first well region 107 and between the isolation structures 106a, and the other oxide layer 102 is located on the second well region 108 and between the isolation structures 106a. In this embodiment, the oxide layer 102 may further be defined as a gate oxide layer. The thickness is increased during the deposition of the oxide layer 102, and the thickness of the oxide layer 102 is defined as a first thickness. Before the gate structure 109a is formed, the defects on the surface of the oxide layer 102 may be removed by wet etching, that is, the thickness of the oxide layer 102 is reduced by wet etching, so that the thickness of the oxide layer 102 is equal to a second thickness, so as to improve the quality of the oxide layer 102. In this embodiment, the first thickness is, for example, 480 Å. After wet etching, the thickness of the oxide layer 102 becomes the second thickness, and the second thickness is, for example, 400 Å.

As shown in FIG. 14, in this embodiment, the oxide layer 102 may be etched, for example, by a wet etching process. For example, the oxide layer 102 is etched with a dilute hydrofluoric acid solution, and the ratio of hydrofluoric acid in the dilute hydrofluoric acid solution to deionized water is 1:300. When the oxide layer 102 is wet etched, the thickness of the oxide layer 102 needs to be reduced. Because the thickness of the oxide layer 102 is increased first, the thickness of the oxide layer 102 is, for example, 450 Å to 500 Å. Therefore, after the wet etching, the defects on the surface of the oxide layer 102 can be removed, and it can be ensured that the oxide layer 102 has a particular thickness. That is, it can be ensured that the oxide layer 102 has good thickness uniformity. After the wet etching, the thickness of the oxide layer 102 can be reduced by 50 Å to 100 Å. After the wet etching, the thickness of the oxide layer 102 is, for example, 380 Å to 400 Å. The material of the oxide layer 102 is, for example, silicon dioxide. The oxide layer 102 may be formed by, for example, high temperature furnace tube oxidation, rapid thermal oxidation, or in-situ vapor generation oxidation. The oxide layer 102 may be defined as a gate oxide layer.

As shown in FIG. 14, in this embodiment, a gate structure 109a is disposed on the oxide layer 102, and the thickness of the gate structure 109a may be between 200 nm and 500 nm, for example, 300 nm or 400 nm. Certainly, the thickness of the gate structure 109a may be set according to an actual requirement. In this embodiment, the gate structure 109a is, for example, a floating gate electrode, the material of the gate structure 109a is, for example, polycrystalline silicon, and the gate structure may be formed by using the method of chemical vapor deposition.

As shown in FIG. 14, in this embodiment, the semiconductor structure may be applied to various integrated circuits. The integrated circuit is, for example, a memory circuit, for example, a random access memory (RAM), a dynamic RAM, a synchronous RAM, a static RAM, a ROM or the like. The integrated circuit may also be a logic device, for example, a programmable logic array, a special integrated circuit, a combined logic integrated circuit, a radio frequency circuit or any other circuit device. The integrated circuit may also be applied to, for example, a user electronic product, for example, a personal computer, a portable computer, a game console, a cellular phone, a personal digital assistant, a video camera, a digital camera or a mobile phone.

In conclusion, the present disclosure provides a semiconductor structure and a manufacturing method thereof. By using the method, the thickness of an oxide layer is increased during the formation of the oxide layer. When a first well region and a second well region are formed in a substrate by ion implantation, the process of ion implantation may damage the structure of the oxide layer and cause defects on the surface of the oxide layer. A particular thickness of the oxide layer is removed by an etching process, so that the defects on the surface of the oxide layer can be effectively removed, thereby improving the quality of the oxide layer. A gate structure is then formed on the oxide layer, so that the reliability of eventually formed semiconductor devices can be improved. By increasing the thickness of the oxide layer, the method can remove a particular thickness of the oxide layer and ensure the thickness of the oxide layer, so as to prevent the oxide layer from penetration.

References to "one embodiment", "an embodiment" or "a specific embodiment" in the whole specification means that the specific features, structures or features described in a combination with the embodiments are included in at least one embodiment of the present disclosure, and are not necessarily included in all embodiments. Therefore, each representation of the phrases "in one embodiment", "in an embodiment" or "in a specific embodiment" in different places of the whole specification does not necessarily refer to the same embodiment. In addition, specific features, structures or features of any particular embodiment of the present disclosure may be combined with one or more other embodiments in any suitable manner. It should be understood that other variations and modifications of the disclosure embodiments described and shown herein may be guided herein and will be considered part of the spirit and scope of the present disclosure.

It should also be understood that one or more of the elements shown in the drawings may also be implemented in a more separate or integrated manner, or even removed because they cannot be operated in some cases, or provided because they can be useful according to a specific application.

Additionally, unless otherwise explicitly specified, any marking arrow in the accompanying drawings shall be merely regarded as exemplary, not limited. Moreover, unless otherwise specified, the term "or" as used herein is generally intended to mean "and/or". Where the term is foreseen because the ability of providing separation or combination is not clear, a combination of components or steps will also be deemed to have been specified.

As described herein and used throughout the following claims, unless otherwise specified, "a", "an" and "the" include plural references. Similarly, as described herein and used throughout the following claims, unless otherwise specified, the meaning of "in" includes "in" and "on".

The above description of the embodiments shown in the present disclosure (including the content described in the abstract of the specification) is not intended to enumerate in detail or limit the present disclosure to the precise form disclosed herein. Although specific embodiments of the present disclosure and examples of the present disclosure are described herein merely for the purpose of description, as will be known and understood by a person skilled in the art, various equivalent modifications may be within the spirit and scope of the present disclosure. As noted, these modifications may be made to the present disclosure in accordance with the above description of the embodiments described in the present disclosure, and these modifications will be within the spirit and scope of the present disclosure.

The system and method have been described in general herein to facilitate understanding of the details of the present disclosure. In addition, various specific details have been given to provide an overall understanding of the embodiments of the present disclosure. However, a person skilled in the art will recognize that the embodiments of the present disclosure may be practiced without one or more specific details, or by using other devices, systems, accessories, methods, components, materials, parts and so on. In other cases, well-known structures, materials and/or operations are not particularly shown or described in detail to avoid confusion in various aspects of embodiments of the present disclosure.

Thus, although the present disclosure has been described herein with reference to its specific embodiments, the modification freedom, various changes, and substitutions are intended to be within the above disclosure, and it should be understood that in some cases, some features of the present disclosure will be adopted in a precondition that without departing from the scope and spirit of the proposed disclosure and in the case that without corresponding use of any other features. Therefore, many modifications can be carried out to adapt a particular environment or material to the substantive scope and spirit of the present disclosure. The present disclosure is not intended to limit the specific terms used in the following claims and/or specific embodiments disclosed as the best way envisaged to perform the present disclosure, but the present disclosure will include any and all embodiments and equivalents falling within the scope of the appended claims. Therefore, the scope of the present disclosure is determined only by the appended claims.

What is claimed is:

1. A method for manufacturing a semiconductor structure, comprising:
    preparing a semiconductor substrate;
    sequentially forming an oxide layer and a sacrificial layer on the semiconductor substrate, wherein the thickness of the oxide layer is a first thickness;
    forming a plurality of trenches in the semiconductor substrate, wherein the trenches extend from the sacrificial layer into the semiconductor substrate;
    forming an isolation dielectric layer on the plurality of trenches and the sacrificial layer, and removing the part of the isolation dielectric layer on the sacrificial layer;
    removing the sacrificial layer so that the isolation dielectric layer forms a filling portion located in the trenches and a protrusion portion protruding from the filing portion, wherein the filling portion and the protrusion portion form an isolation structure, wherein the filing portion is located in the semiconductor substrate and the oxide layer, and the protrusion portion protrudes from the oxide layer;
    forming a well region in the semiconductor substrate by ion implantation, during which process the oxide layer is damaged by implanted ions, resulting in a damaged oxide layer;
    after the well region is formed by ion implantation, etching part of the damaged oxide layer that is damaged by implanted ions to obtain an etched oxide layer, so that the thickness of the etched oxide layer is a second thickness, wherein the first thickness is greater than the second thickness; and
    after the etched oxide layer is obtained, forming a polysilicon gate on the etched oxide layer.

2. The method as in claim 1, wherein the first thickness is 450 Å to 500 Å, and the thickness of the sacrificial layer is 1400 Å to 1600 Å.

3. The method as in claim 2, wherein the second thickness is 380 Å to 400 Å.

4. The method as in claim 1, wherein the depth of the trenches are 2000 Å to 9000 Å.

5. The method as in claim 1, wherein the sacrificial layer is removed through a wet etching process.

6. The method as in claim 1, wherein the well region comprises a first well region and a second well region adjacent to each other.

7. The method as in claim 6, wherein the depth of the first well region is 1.4 µm to 1.6 µm, and the depth of the second well region is 1.4 µm to 1.6 µm.

8. The method as in claim 6, wherein the isolation structures are located between the first well region and the second well region.

9. The method as in claim 1, wherein the oxide layer is etched with a dilute hydrofluoric acid solution, the ratio of hydrofluoric acid in the dilute hydrofluoric acid solution to deionized water is 1:300 to 1:400, and the etching time is 300 s to 400 s.

10. A semiconductor structure formed by using the method as in claim 1, comprising:
    a semiconductor substrate;
    a plurality of oxide layers, comprising at least a first oxide layer and a second oxide layer, disposed on the semiconductor substrate;
    a plurality of isolation structures, disposed in the semiconductor substrate, wherein the top surface of the isolation structures is higher than the surface of the semiconductor substrate and lower than the top surface of the oxide layers, wherein a cross section of each of the a plurality of isolation structures is an inverted trapezoid;
    a first well region, disposed in the semiconductor substrate;
    a second well region, adjacent to the first well region, disposed in the semiconductor substrate, wherein one of the plurality of isolation structures is located between the first well region and the second well region, and between the first oxide layer and the second oxide layer, wherein the first oxide layer is disposed above the first well region, and the second oxide layer is disposed above the second well region, wherein the plurality of oxide layers is in direct contact with the first well region and the second well region; and
    gate structures, disposed on the oxide layers.

* * * * *